United States Patent
de Bont

(10) Patent No.: US 9,305,537 B2
(45) Date of Patent: Apr. 5, 2016

(54) SIGNAL PROCESSING APPARATUS CONCEALING IMPULSE NOISE BY AUTOREGRESSIVE MODELING

(71) Applicant: NXP B.V., Eindhoven (NL)

(72) Inventor: Sebastiaan de Bont, Eindhoven (NL)

(73) Assignee: NXP B.V., Eindhoven (NL)

( * ) Notice: Subject to any disclaimer, the term of this patent is extended or adjusted under 35 U.S.C. 154(b) by 166 days.

(21) Appl. No.: 14/142,727

(22) Filed: Dec. 27, 2013

(65) Prior Publication Data

US 2014/0219454 A1   Aug. 7, 2014

(30) Foreign Application Priority Data

Dec. 31, 2012   (EP) ..................................... 12199841

(51) Int. Cl.
| | |
|---|---|
| *G10K 11/16* | (2006.01) |
| *G10L 21/0224* | (2013.01) |
| *G10L 19/005* | (2013.01) |
| *H03G 3/34* | (2006.01) |
| *G10L 21/0264* | (2013.01) |

(52) U.S. Cl.
CPC ............. *G10K 11/16* (2013.01); *G10L 19/005* (2013.01); *G10L 21/0224* (2013.01); *H03G 3/345* (2013.01); *G10L 21/0264* (2013.01)

(58) Field of Classification Search
None
See application file for complete search history.

(56) References Cited

U.S. PATENT DOCUMENTS

| | | | |
|---|---|---|---|
| 4,528,678 A | 7/1985 | Udren | |
| 4,839,843 A | 6/1989 | Veldhuis | |
| 5,224,061 A | 6/1993 | Veldhuis | |
| 5,535,280 A | 7/1996 | Chahabadi et al. | |
| 7,260,163 B2 | 8/2007 | Li et al. | |
| 2003/0148745 A1* | 8/2003 | Nystrom et al. | 455/136 |
| 2007/0033015 A1 | 2/2007 | Taira et al. | |
| 2007/0049227 A1 | 3/2007 | Su | |
| 2007/0271092 A1* | 11/2007 | Ehara et al. | 704/209 |
| 2009/0054022 A1* | 2/2009 | Kobayashi et al. | 455/186.1 |
| 2009/0310795 A1* | 12/2009 | Apsey et al. | 381/71.1 |
| 2010/0284557 A1* | 11/2010 | Fitz | 381/317 |
| 2011/0201290 A1* | 8/2011 | Miyagi et al. | 455/226.1 |
| 2014/0219454 A1* | 8/2014 | de Bont | 381/13 |

OTHER PUBLICATIONS

Canazza, Sergio, et al.; "Restoration of Audio Documents by Means of Extended Kalman Filter"; IEEE Transaction on Audio, Speech and Language Processing, vol. 18, No. 6, IEEE Service Center, New York, NY, USA; pp. 1107-1115 (Aug. 1, 2010).

(Continued)

*Primary Examiner* — Thang Tran
*Assistant Examiner* — Mark Fischer
(74) *Attorney, Agent, or Firm* — Rajeev Madnawat

(57) ABSTRACT

A signal processing apparatus (100) comprising a noise detector (102) configured to: receive a stream of information representative of a stream of audio signal samples (112); and detect samples in the received stream of information (112) that are distorted by impulse noise in order to generate a noise detection signal (114), wherein the noise detection signal (114) also identifies preceding and succeeding samples that are undistorted. The signal processing apparatus (100) also comprises a processor (104) configured to replace distorted samples in the received stream of information with composite predicted values (426; 526) to provide a reconstructed stream of audio signal samples (116).

14 Claims, 10 Drawing Sheets

(56) References Cited

OTHER PUBLICATIONS

Ekman, Anders, et al; "Regularized Linear Prediction of Speech"; IEEE Transactions on Audio, Speech and Language Processing, vol. 16, No. 1; IEEE Service Center, New York, NY, USA, pp. 65-73 (Jan. 1, 2008).

Janssen, A.J.E.M., et al; "Adaptive Interpolation of Discrete-Time Signals That Can Be Modeled as Autoregressive Processes"; IEEE Transactions on Acoustics, Speech and Signal Processing, vol. ASSP-34, No. 2; pp. 317-330 (Apr. 1986).

Veldhuis, Raymond N.J.; Adaptive Restoration of Unknown Samples in Discrete-Time Signals and Digital Images (Apr. 8, 1955).

Extended European Search Report for Application 12199841.3 (Mar. 26, 2013).

* cited by examiner

SIGNAL PROCESSING APPARATUS CONCEALING IMPULSE NOISE BY AUTOREGRESSIVE MODELING

CROSS-REFERENCE TO RELATED APPLICATIONS

This application claims the priority under 35 U.S.C. §119 of European patent application no. 12199841.3, filed on Dec. 31, 2012, the contents of which are incorporated by reference herein.

The present disclosure relates to the field of signal processing and in particular, although not necessarily, impulse noise concealment by autoregressive modelling that can be used in audio signal processing.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

According to a first aspect of the invention, there is provided a signal processing apparatus comprising:
  a noise detector configured to:
    receive a stream of information representative of a stream of audio signal samples;
    detect samples in the received stream of information that are distorted by impulse noise in order to generate a noise detection signal, wherein the noise detection signal also identifies preceding and succeeding samples that are undistorted;
  a processor configured to:
    receive a stream of information representative of the stream of audio signal samples;
    receive the noise detection signal from the noise detector;
    determine, based on preceding and/or succeeding undistorted samples in the received stream of audio signal samples, auto-regressive model parameters;
    apply the auto-regressive model parameters to the preceding undistorted samples to determine forward linear predicted values of the distorted samples;
    apply the auto-regressive model parameters to the succeeding undistorted samples to determine backward linear predicted values of the distorted samples;
    combine the forward and backward linear predicted values by means of a window function to determine composite predicted values of the distorted samples; and
    replace the distorted samples in the received stream of information with the composite predicted values to provide a reconstructed stream of audio signal samples.

Detecting and replacing distorted audio signal samples in this way enables improvements in the performance of an audio device when it receives an input signal that is distorted by impulse noise.

The processor may be further configured to determine the stability of the auto-regressive model parameters. If the stability is determined to be below a predetermined threshold value, then the processor may be configured to replace the estimated auto-regressive model parameters with previously determined stable auto-regressive model parameters for further processing.

The processor may be configured to determine the auto-regressive model parameters in response to detection of a sample distorted by impulse noise. This may be referred to as batch processing.

The processor may be configured to receive a different representation of the same stream of audio signal samples to that received by the noise detector.

The noise detector may be configured to receive a multiplex signal representative of the stream of audio signal samples. The processor may be configured to receive a sum signal and a difference signal representative of the stream of audio signal samples; and provide a reconstructed sum signal and a reconstructed difference signal.

The processor may be configured to receive the same representation of the stream of audio signal samples to that received by the noise detector.

The processor and the noise detector may be configured to receive a multiplex signal representative of the stream of audio signal samples.

The received multiplex signal may comprise a pilot signal. The processor may be configured to subtract the pilot signal from the multiplex signal, to provide a subtracted multiplex signal that is used to estimate the auto-regressive parameters; and add the pilot signal to the reconstructed stream of audio samples.

The processor may be configured to calculate an auto-correlation vector in order to determine the auto-regressive model parameters.

The processor may be configured to calculate an auto-correlation vector in response to receiving an undistorted sample. This may be referred to as a tracking mode of operation.

The processor may be further configured to apply lag-windowing to the auto-correlation vector and determine the auto-regressive model parameters using the lag-windowed auto-correlation vector. This can improve the stability of the auto-regressive model parameters.

There may be provided an integrated circuit comprising any signal processing apparatus disclosed herein.

According to a further aspect of the invention, there is provided a method of operating a signal processing apparatus, the method comprising:
  receiving a stream of information representative of a stream of audio signal samples;
  detecting samples in the received stream of information that are distorted by impulse noise, thereby also identifying preceding and succeeding samples that are undistorted;
  determining, based on preceding and/or succeeding undistorted samples in the received stream of audio signal samples, auto-regressive model parameters;
  applying the auto-regressive model parameters to the preceding undistorted samples to determine forward linear predicted values of the distorted samples;
  applying the auto-regressive model parameters to the succeeding undistorted samples to determine backward linear predicted values of the distorted samples;
  combining the forward and backward linear predicted values by means of a window function to determine composite predicted values of the distorted samples; and
  replacing the distorted samples in the received stream of information with the composite predicted values to provide a reconstructed stream of audio signal samples.

There may be provided a computer program, which when run on a computer, causes the computer to configure any signal processing apparatus or integrated circuit disclosed herein, or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

There may be provided an audio entertainment system comprising any signal processing apparatus disclosed herein or any integrated circuit discloses herein.

A description is now given, by way of example only, with reference to the accompanying drawings, in which.

Figure 1:
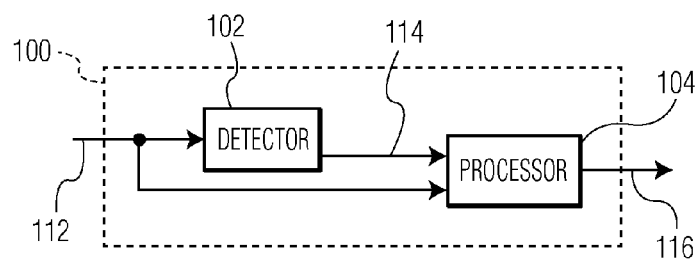
FIG. 1 illustrates schematically a signal processing apparatus capable of detecting and concealing impulse noise according to an embodiment of the invention.

FIG. 1 illustrates a signal processing apparatus 100 comprising a detector 102 and a processor 104. The detector receives a signal 112 representative of a stream of audio signals and detects samples that are distorted by impulse noise, also called impulsive noise, in the received signal 112. In addition to detecting samples of the received signal 112 that are distorted by impulse noise, the detector 102 also, either directly or indirectly, identifies preceding and succeeding samples as undistorted. The detector 102 provides a noise detection signal 114 to the processor 104. The noise detection signal 114 identifies which samples of the received signal 112 are distorted by impulse noise. Further details of an example detector 102 are provided below with reference to FIG. 2.

The processor 104 processes the noise detection signal 114 and the received signal 112 and provides a reconstructed signal 116 in which the distorted samples of the signal have been replaced with replacement samples. The replacement samples are undistorted samples, or at least preferably less distorted samples than the original samples.

The processor 104 estimates autoregressive model parameters, based on the preceding and/or succeeding undistorted samples as identified by the noise detection signal 114. The processor 104 then applies the autoregressive model parameters to the preceding undistorted samples to determine forward linear predicted values of the distorted samples and applies the autoregressive model parameters to the succeeding undistorted samples to determine backward linear predicted values of the distorted samples. The processor 104 then combines the forward and backward linear predicted values together by means of a window function to determine composite predicted values of the distorted samples. Further details of an example of this process of determining forward and backward predicted values and combining them are provided below with reference to FIG. 3.

The processor 104 then replaces the distorted samples in the received signal 112 with the composite predicted values to provide a reconstructed stream of audio signal samples 116. This reconstructed stream 116 is consequently free from any impulse noise found in the received signal 112, or at least the effects of impulse noise are preferably reduced.

Figure 2:
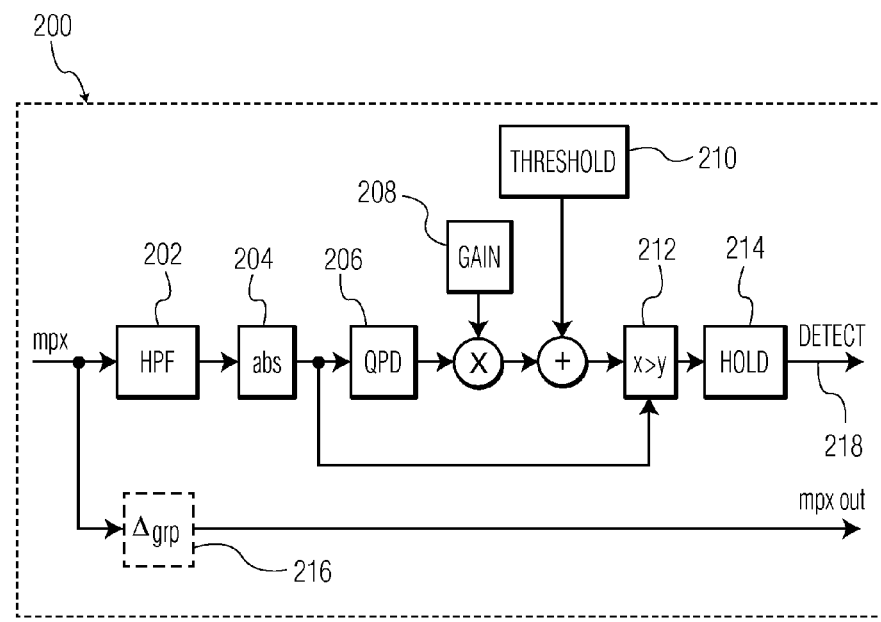
FIG. 2 illustrates schematically an impulse noise detection system according to an embodiment of the invention.

FIG. 2 provides a schematic illustration of an impulse noise detector 200. The incoming signal is a wideband multiplex signal (325 kHz sample-rate). This real multiplex signal contains the sum signal, a pilot, the difference signal (around 38 kHz) and optionally some RDS data (at around 57 kHz). Any other signal that is present above, for example, approximately 80 kHz can be considered noise because it does not belong to one of the intended signal components.

The HPF block 202 is a high pass filtering block that ensures that only the signal content above for example 80 kHz (this is sometimes referred to as ultra sonic noise (USN)) is processed downstream.

The abs block 204 takes the absolute value of the high pass filtered multiplex signal such that negative values become positive values. The instantaneous signal energy of the output of the abs block 204 is compared with a long term average of the ultra sonic noise by a comparator 212. A QPD (quasi-peak-detector) block 206 provides the long term average (sometimes called a noise floor estimate) using a low pass filter. If the instantaneous value exceeds the long term average by some minimum amount, as defined by a threshold 210 that is added to a signal that is the product of a gain value 208 and the output of the QPD block 206, it is determined that impulse noise is present.

When impulse noise is detected, the output of the comparator 212 will be a logical 1. When no impulse noise is detected, the comparator 212 will output a logical 0. A hold block 214 can optionally be provided to hold the output signal of the comparator 212 at a value of logical 1 for an extended period when impulse noise is detected.

The signal output from hold block 214 is a detection signal 218. The detection signal 218 provides information representative of when the incoming wideband multiplex signal is distorted by impulse noise.

The incoming wideband multiplex signal is also supplied to a delay compensation block 216, which delays the incoming signal such that the output from the delay compensation block is time-aligned with the detection signal 218.

In some embodiments, the noise concealment that is performed by the processor of FIG. 1 is triggered by a low to high transition of the detection signal 218. The processor may become sensitive again for this trigger only after a full concealment of a single pulse of noise has been completed.

Figure 3:
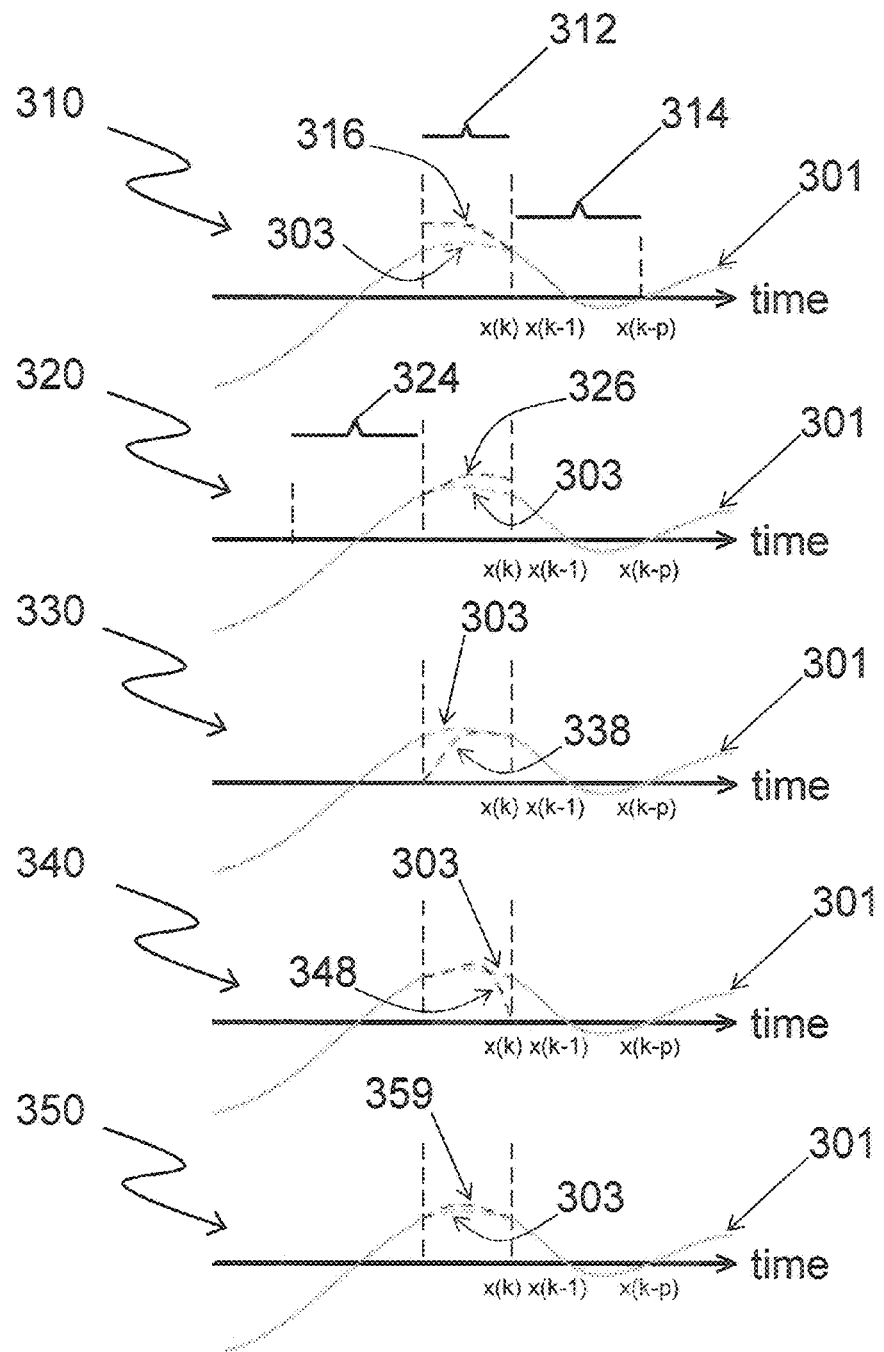
FIG. 3 illustrates a process by which forward and backward linear predictions are determined and then combined to provide a replacement signal according to an embodiment of the invention.

FIG. 3 illustrates a process that can be performed by the processor of FIG. 1 in order to generate a reconstructed signal. The process is illustrated by five charts 310, 320, 330, 340, 350 that graphically illustrate how a received signal 301 is processed. In each of the charts, the amplitude of the received signal 301 is shown on the vertical axis and time is shown on the horizontal axis. An interval of time is shown with reference 312 in each of the charts, during which samples in the original signal are identified as distorted by impulse noise. This interval of time will be referred to as the distortion interval 312.

Each of the five charts shows a representation of the original signal that would have been received if there had been no distortion. This will be referred to as the undistorted signal 303 and is shown as the dotted line over the distortion interval 312. The processing illustrated in FIG. 3 aims to reconstruct the undistorted signal 303 as closely as possible using portions of the received signal 301 that precede and succeed the distortion interval 312.

The first chart 310 shows a preceding time interval 314 that is immediately before the distortion interval 312. As shown on the time axis of the first chart 310, the preceding time interval 314 relates to samples x(k) to x(k-p). In some examples, p may be about 20, which means that 20 samples are present in the preceding time interval 314.

The samples in the preceding time interval 314 are used to estimate autoregressive model parameters, as is well known to one skilled in the art. These autoregressive model parameters are then applied to the samples in the preceding time interval 314 in order to determine forward linear predicted values for the samples in the distortion interval 312.

The values of the forward linear predicted values for the samples are shown in the first chart 310 as the upper dotted line 316 during the distortion interval 312.

The distorted signal is not illustrated in the first chart 310.

The second chart 320 of FIG. 3 illustrates a process for determining backward linear predicted values 326, which is similar to that of the first chart 310.

The second chart 320 shows a succeeding time interval 324 that is immediately after the distortion interval 312. The number of samples in the succeeding time interval 324 may be the same or different to the number of samples in the preceding time interval 314.

The samples in the succeeding time interval 324 are used to estimate autoregressive model parameters, as is well known to one skilled in the art. These autoregressive model parameters are then applied to the samples in the succeeding time interval 324 in order to determine backward linear predicted values for the samples in the distortion interval 312. The values of the backward linear predicted values for the samples are shown in the second chart 320 as the upper dotted line 326 during the distortion interval 312.

The third chart 330 of FIG. 3 illustrates the effect of a windowing function applied to the forward linear predicted values 316 for the samples in the distortion interval 312 that are shown in the first chart 310. The windowed values are shown in the third chart 330 as the lower dotted line 338 over the distortion interval 312. It can be seen that the windowing function reduces the amplitude of the predicted values by a progressively greater amount the further away the prediction gets from the preceding interval 314, which was used to generate the forward linear predicted values.

The fourth chart 340 of FIG. 3 illustrates the effect of a windowing function applied to the backward linear predicted values 326 for the samples in the distortion interval 312 that are shown in the second chart 320. The windowed values are shown in the third chart 330 as the lower dotted line 348 over the distortion interval 312. Once again, it can be seen that the windowing function reduces the amplitude of the predicted values by a progressively greater amount the further away the prediction gets from the succeeding interval 324, which was used to generate the backward linear predicted values.

The fifth chart 350 of FIG. 3 shows the result of combining the windowed forward and backward linear predicted values shown in the third and fourth charts 330, 340.

This combination provides composite predicted values 359 of the samples in the distortion interval 312, which are shown as a dotted line in the fifth chart 350. It can be seen that the composite predicted values 359 provide a good approximation to the original undistorted signal 303. These composite predicted values can then be used to replace the distorted samples to provide at least a substantial reduction in the effects of impulse noise.

Figure 4:
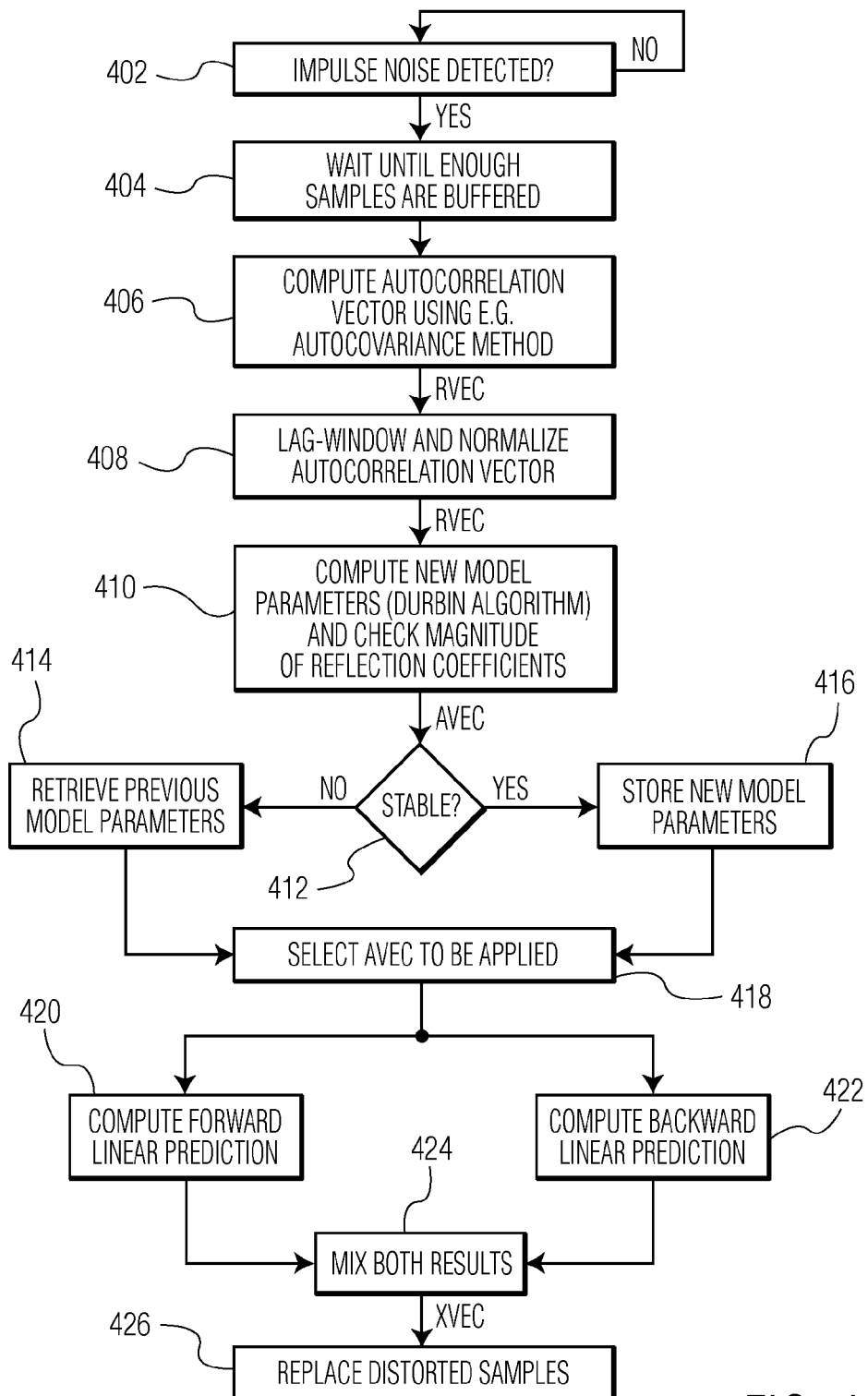
FIG. 4 illustrates schematically a batch-mode noise detection and concealment process according to an embodiment of the invention.

FIG. 4 is a flow diagram that illustrates a process of noise detection and concealment implemented in a batch mode of processing. In FIG. 4, the data value of each received sample is loaded into a buffer.

The first step 402 consists of checking whether or not impulse noise is detected in the most recently received sample. If no impulse noise is detected then the process simply repeats the first step 402 for a subsequent sample until impulse noise is detected.

When impulse noise is detected at step 402, the process moves on to step 404 to wait until a sufficient number of undistorted samples are buffered. The number of undistorted samples that is considered sufficient is one that is considered likely to enable an accurate autocorrelation vector to be calculated. Once a sufficient number of samples are buffered, for example once the number of buffered samples exceeds a threshold, the process moves on to the next step 406 of computing the autocorrelation vector. Typically, the length of the signal segment used for the correlation estimation should be of the order of 10 ms. This is the period of a speech or audio signal where the statistical properties are assumed to be stationary or can be considered as not changing significantly. The number of samples depends on the applied sampling rate. For 40 kS/s, for example, the total number of samples may be about 400. However, a choice exists as to how many of these samples are to be used as preceding samples or succeeding samples at steps 420 and 422 as discussed below. A sufficient number of samples should also be buffered at step 404 to enable the forward and backward linear predictions to be performed successfully at steps 420 and 422 as discussed below. A sufficient number of samples should also be buffered at step 404 to enable the forward and backward linear predictions to be performed successfully at steps 420 and 422. Typically the number of preceding samples is larger than the number of succeeding samples.

The autocorrelation vector $r_{vec}$ can be estimated from all available data present in the buffer. The (P+1) elements of this vector are computed as follows:

$$r_{vec}(j) = \sum_{k=P}^{N-1} x(k)x(k-j)$$

Where:
k is the buffer index;
x(k) is the data at location k; and
j is the time lag index running from 0 to prediction order P.
Therefore, the summation indicated above has to be executed (P+1) times per execution of the algorithm for each time-lag j.

The above principle is well-known as the autocovariance method.

The stability of the autocorrelation vector computed at step 406 can optionally be improved at step 408 by lag-windowing and normalizing the autocorrelation vector, as discussed below. This can be very useful for a fixed-point implementation of the algorithm.

Model estimation is then performed at step 410 by computing autoregressive model parameters from the autocorrelation vector. The autoregressive model parameters may be computed using the known Durbin algorithm, which is also known as the Levinson-Durbin algorithm.

In one example, an autoregressive parameter vector comprising the autoregressive model parameters is obtained by solving a linear system of equations of a special type:

$$R\, a_{vec} = -r$$

The elements of matrix R and vector r have the following relation, where r is the previously determined autocorrelation vector $r_{vec}$ and p the prediction order:

$$\begin{bmatrix} r_{vec}(0) & r_{vec}(1)^* & \cdots & r_{vec}(p-1) \\ r_{vec}(1) & r_{vec}(0) & \cdots & r_{vec}(p-2)^* \\ \vdots & \ddots & \ddots & \vdots \\ r_{vec}(p-1) & \cdots & r_{vec}(p-2) & r_{vec}(0) \end{bmatrix} \begin{bmatrix} a_{vec}(1) \\ a_{vec}(2) \\ \vdots \\ a_{vec}(p) \end{bmatrix} = \begin{bmatrix} -r_{vec}(1) \\ -r_{vec}(2) \\ \vdots \\ -r_{vec}(p) \end{bmatrix}$$

This special system can be solved efficiently $O(p^2)$ by the so called Durbin algorithm.

The parameters $a_{vec}(k)$ can be seen as the coefficients of the following recursive filter (in speech-coding called a synthesis filter):

$$H(z) = \frac{1}{A(z)} = \frac{1}{1 + a_{vec}(1)z^{-1} + \ldots a_{vec}(p)z^{-p}}$$

The autoregressive model parameters are used as the coefficients of a recursive filter. The magnitude of these filter coefficients are then checked at step 412 to determine whether they relate to a stable or unstable filter. The stability can be checked at each iteration of the Durbin algorithm. A variable, known as a reflection coefficient, can be computed, from which the stability of the intermediate result can be determined. If the result becomes unstable, it will remain unstable and can thus be discarded without further computation.

In some instances, the use of a Durbin algorithm may provide autoregressive model parameters that are unusable because the filter coefficients of the resulting synthesis filter define an unstable infinite impulse response (IIR) filter. However, the likelihood of the filter coefficients being found unstable can be reduced, as mentioned above, by performing a lag-windowing operation to the auto-correlation vector at step 408. This lag-windowing operation may be the application of a Gaussian window that moves the poles of the resulting filter coefficients closer to the origin of the complex plane and away from the unit circle, which represents more stable filter coefficients. For an autocorrelation vector $r_{vec}$ of length P+1, the windowing coefficients are given by:

$$w(k) = e^{\left(-\frac{\pi f_0}{f_s} k\right)}$$

Where:
k runs from 1 to p,
$f_s$ is the sampling frequency in Hz, and
$f_0$ is the bandwidth expansion parameter (a value of 60 is typical for a speech-codec) in Hz.

The first value of the autocorrelation factor $r_{vec}(0)$ (representing the power estimate for the signal segment) is left unaltered.

At step 412, the process checks the stability of the filter coefficients computed at step 410. If the filter coefficients are found to be stable, then the corresponding model parameters are stored in a memory at step 416. Alternatively, if the filter coefficients are found to be unstable, then the process proceeds to step 414, where previously determined stable model parameters are retrieved from a memory. While the use of a previously determined model may not provide as good an estimation as the use of a stable model computed from the samples that precede and succeed the particular incidence of impulse noise, it is nonetheless likely to provide a significantly better result than skipping the signal reconstruction process altogether.

At step 418 the process then selects the autoregressive model parameters/filter coefficients to be used in accordance with the result of the stability check at step 412 and subsequent operation performed at either step 414 or 416. The selected parameters are used to compute forward linear predicted values for the distorted samples at step 420 and backward linear predicted values for the distorted samples at step 422. The computations at steps 420 and 422 can be performed in parallel as shown in FIG. 4.

The autoregressive model is given by the prediction coefficients vector with model order P:

$$\vec{a} = [1\ a_1\ a_2\ \ldots\ a_p]$$

The forward prediction of the M missing samples can be obtained by:

$$x_{fwd}(k) = \sum_{n=1}^{P} x(k-n)a_n$$

The index k represents the index of the missing samples and runs from 0 to M-1.

The backward prediction of the M missing sample can be computed by:

$$x_{fwd}(k) = \sum_{n=1}^{P} x(k+n)a_{(P+1-n)}$$

The index k represents the index of the missing samples and runs from M-1 to 0.

At step 424, the forward and backward predicted values for the distorted samples are combined to provide composite predicted values for the distorted samples, as discussed above in relation to FIG. 3.

In one example, the two sets of predicted values are combined by mixing the resulting vectors with the right half of a Hanning window:

$$\vec{w} = [w_0\ w_1\ w_2\ \ldots\ w_{M-1}]$$

$$x_{res}(k) = x_{fwd}(k)w_k + x_{bck}(k)(1 - w_k)$$

The index k represents the index of the missing samples and runs from 0 to M-1.

Finally, at step 426 the process replaces the distorted samples with the composite predicted values determined at step 424. The resultant reconstructed signal may also be referred to as an interpolated signal.

Figure 5:
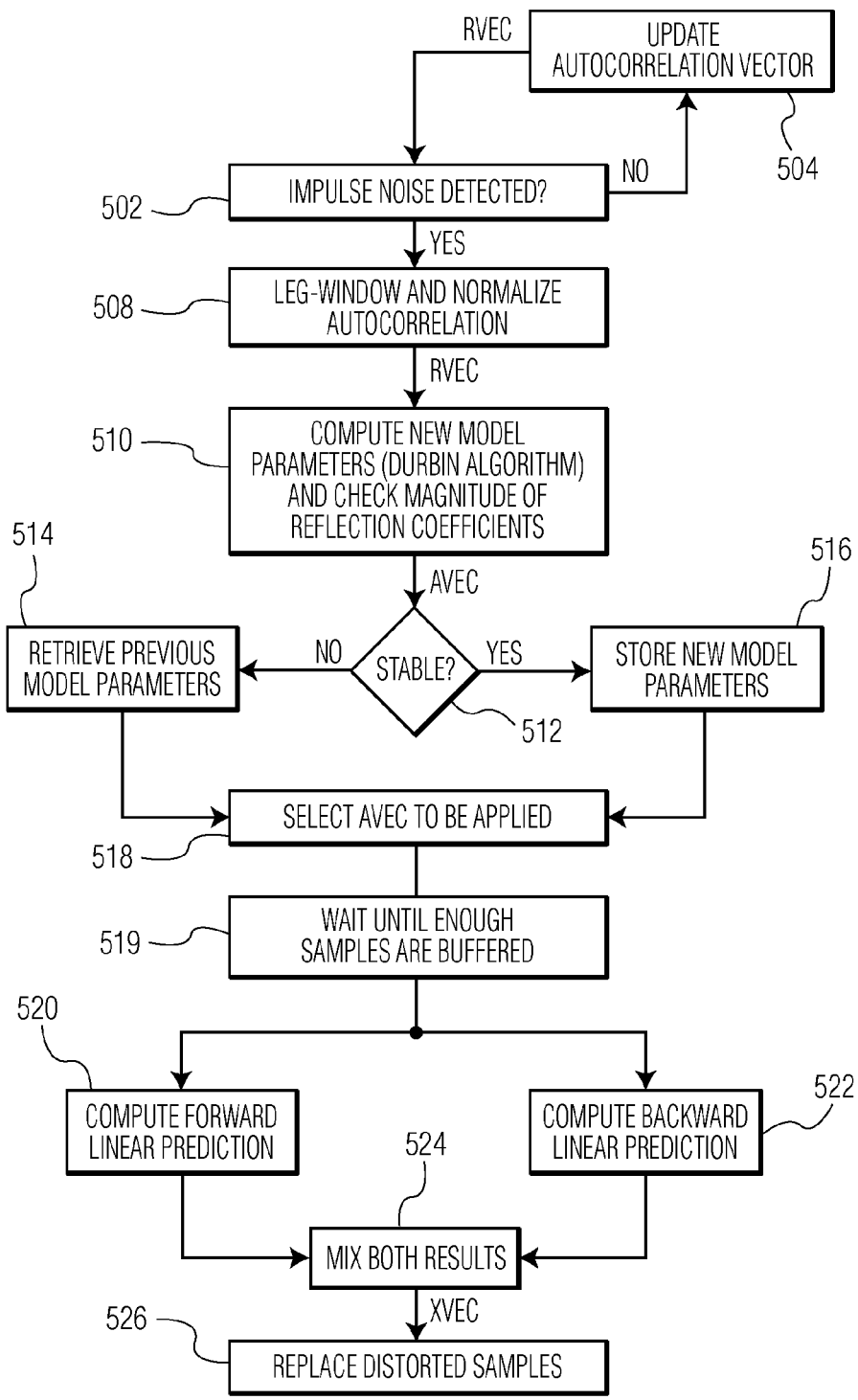
FIG. 5 illustrates schematically a tracking-mode noise detection and concealment process according to an embodiment of the invention.

FIG. 5 illustrates a similar process to that of FIG. 4. However, in FIG. 5 the process operates in tracking mode, which means that the autocorrelation vector is continuously updated as new samples are received. This is in contrast to the process of FIG. 4, in which the autocorrelation vector is only determined when it is considered necessary following the detection of impulse noise.

In FIG. 5, the data value of each received sample is loaded into a buffer.

The first step 502 of the process consists of checking the received sample for the presence of impulse noise. If impulse noise is not detected, then the autocorrelation vector is updated at step 504 in accordance with the received undistorted sample that has most recently been loaded into the buffer. More particularly, the autocorrelation vector $r_{vec}$ is calculated by the following equation, which corresponds to a first order recursive filter:

$$r_{vec}(j;n) = \lambda r_{vec}(j;n-1) + (1-\lambda)x(n)x(n-j)$$

Where:
x(n) is the value of the most recently added sample to the buffer;
n is the time index;
j is the time lag index running from 0 to prediction order P,
λ is known as a forgetting parameter, with a value typically close to one, which means that it slowly tracks changes in the signal. The value of the parameter λ needs careful tuning and depends on the used sampling frequency.

By continuously updating the autocorrelation vector in this way, the load on the processor is maintained at a relatively consistent level, which can be beneficial in some applications. A disadvantage of using batch mode processing in some embodiments is that the processor will be subject to much higher peak loads when computing the autocorrelation vector only when required. A tracking mode process may therefore be easier to implement in some applications.

Once impulse noise is detected at step 502 the process moves on to steps 508 to 518 for selecting the autoregressive model parameters/filter coefficients to be used. Steps 508 to 518 are the same as the corresponding steps in the 400 series of FIG. 4, and will not be described again in detail here.

Once the autoregressive model parameters to be used have been selected at step 518, the process then waits until a sufficient number of samples have been read into a memory at step 519. Here the buffered number of samples must be sufficient to compute the backward linear predicted values at next step 522.

The process of FIG. 5 continues by calculating forward and backward linear predicted values, combining the two sets of predicted values and then replacing the distorted samples at steps 520, 522, 524, and 526 that are the same as the corresponding steps in the 400 series of FIG. 4.

Figure 6:
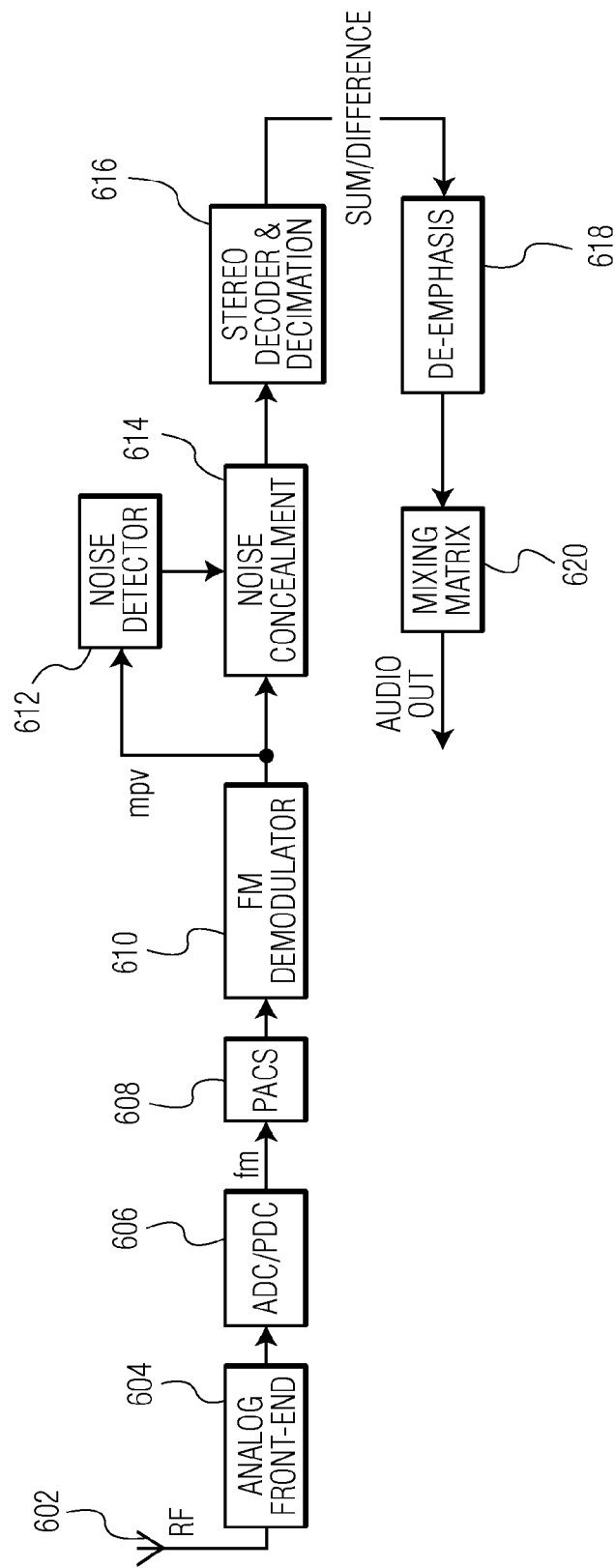
FIG. 6 illustrates schematically an embodiment of the invention in which noise detection and concealment are applied to a multiplex signal in an FM radio receiver.

FIG. 6 is a schematic diagram of the architecture of an FM radio receiver incorporating an embodiment of the claimed invention. A radio frequency signal is received by a radio antenna 602. The radio frequency signal is processed by analogue front end circuitry 604 (possibly at intermediate-frequency), which primarily mixes the required FM channel to baseband.

The output signal of the analogue front end circuitry 604 is digitized and decimated by an analogue to digital convertor (ADC) and primary decimation chain (PDC) 606 so as to occupy a single FM channel.

The resultant digital signal is then low-pass filtered by an adjacent-channel suppression filter (which may be a variable low-pass filter such as a precision adjacent channel suppressor (PACS) filter) 608, which may have an adjustable cut-off frequency to reduce the bandwidth of the FM signal in the presence of adjacent channels or under weak-signal conditions. The side-effect of this filter is that its impulse response spreads out the impulse noise distortion in time.

The low-pass filtered signal is demodulated by an FM demodulator 610 to form a real multiplex signal.

The real multiplex signal is provided to both a noise detector 612 and a noise concealer 614. The noise detector 612 identifies samples that are distorted by noise. The noise concealer 614 replaces the distorted samples with samples that are closer to the original undistorted samples to provide a reconstructed signal, optionally using the process of FIG. 4 or FIG. 5.

The reconstructed signal is stereo decoded and decimated by a decoder 616 to provide a sum and a difference signal. De-emphasis is applied to the sum and difference signals at a filter 618, and the resultant signal is processed by a mixing matrix 620 to provide audio left and right channel output signals.

The noise detector 612 and noise concealer 614 are therefore configured to receive the same signal, which in the example of FIG. 6 is a real multiplex signal. The noise detector 612 provides a noise detection signal to the noise concealer 614 that is indicative of the location of impulse noise within the received signal so that the noise concealer 614 can replace the noisy samples. It will be appreciated that embodiments of the invention could work with other types of noise, for example, embodiments could be used to conceal short distortions arising from the multipath effect.

Figure 7:
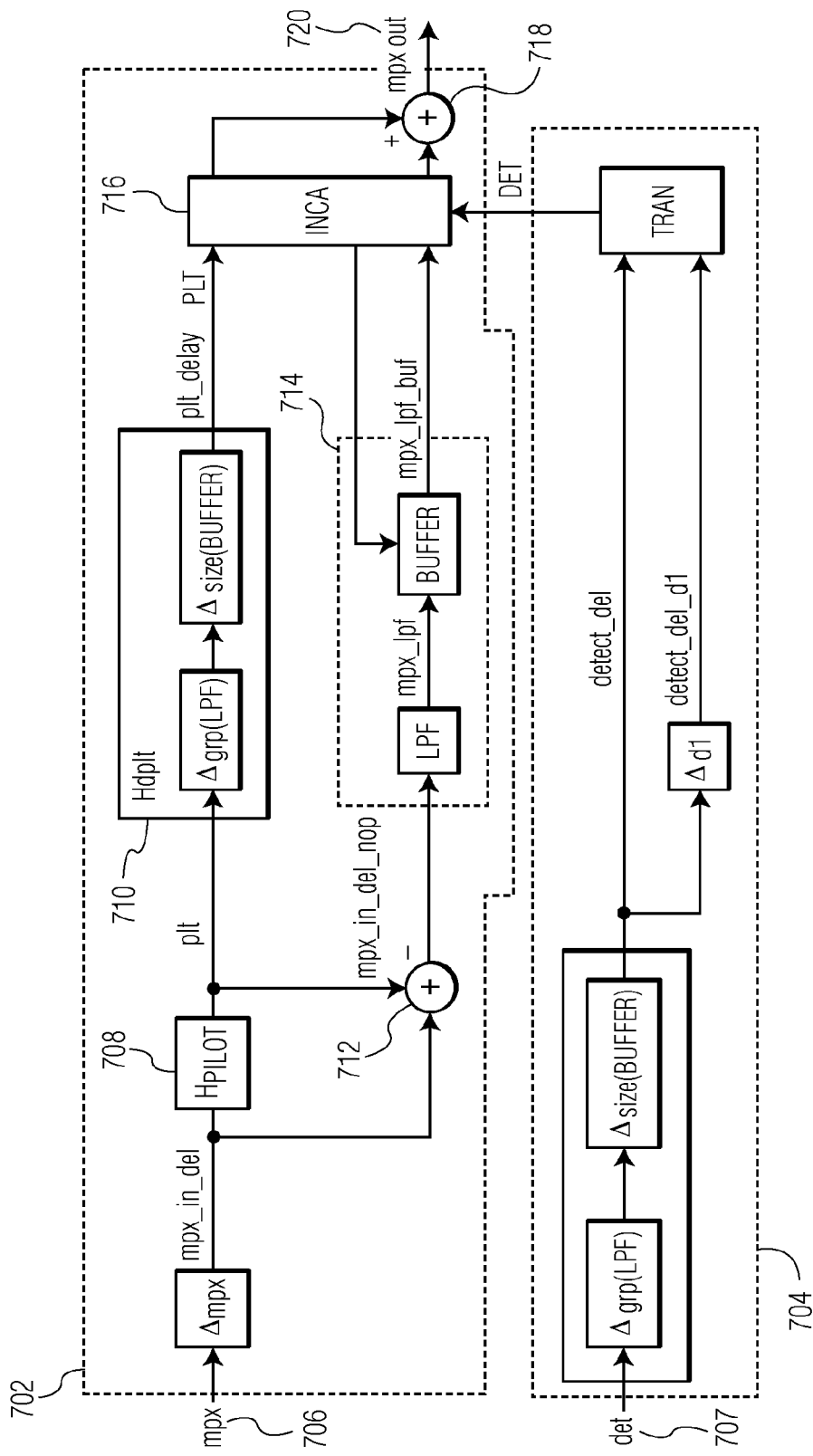
FIG. 7 illustrates a noise detector and a noise concealer according to an embodiment of the invention.

FIG. 7 depicts an exemplary noise concealer 702 and noise detection signal processor 704, which could be used in the FM receiver of FIG. 6. The noise concealer 702 receives a multiplex signal 706 distorted by impulse noise. The noise detection signal processor 704 receives a detection signal 707, such as the signal 218 produced by the noise detector of FIG. 2. The detection signal 707 is representative of when the multiplex signal 706 is distorted by impulse noise. The noise detection signal processor 704 illustrates a structure for transforming the detection signal 707, discussed above in relation to FIG. 2, into a transition detection signal. Noise concealment is triggered by a low to high transition of the detection signal in this example.

It is well known that broadcast FM signals may comprise a pilot signal, used for certain control purposes. A very steep bandpass filter 708 is used to filter out the pilot signal from the input multiplex signal 706 before it is provided to a concealer 716 as the pilot signal is not needed to perform noise concealment. The steep filtering of the pilot signal makes it very insensitive to impulse noise distortion. However, the isolated pilot signal should be restored to the multiplex signal after the concealment of impulse noise, as the pilot signal is necessary for stereo decoding.

The isolated pilot signal is delayed, by delay block 710, to provide a delayed isolated pilot signal for correct in-phase restoration of the pilot signal to the output multiplex signal.

The pilot signal is removed from the multiplex signal by a subtractor 712 to provide a subtracted multiplex signal. The subtracted multiplex signal is then band limited (for example to the bandwidth of a sum signal (15 KHz) or to the bandwidth of a sum and difference signal (53 KHz)) and read into a buffer memory 714.

An impulse noise concealment algorithm is then executed on data from the buffer memory 714 by a concealer 716. The concealer 716 then supplies the multiplex signal with noise concealed, and the delayed isolated pilot signal from the delay block 710, to an adder 718 where these two signals are added together. This provides an output signal 720 comprising a noise concealed multiplex signal with a pilot signal, which can be supplied to a stereo decoder such as is illustrated in FIG. 6.

During impulse noise concealment, the FM signal can be treated as mono rather than stereo, by ignoring the difference signal. Provided gaps in the signal, where impulse noise occurs, are not too long, the lack of treatment of the difference signal may be hardly noticeable.

Figure 8:
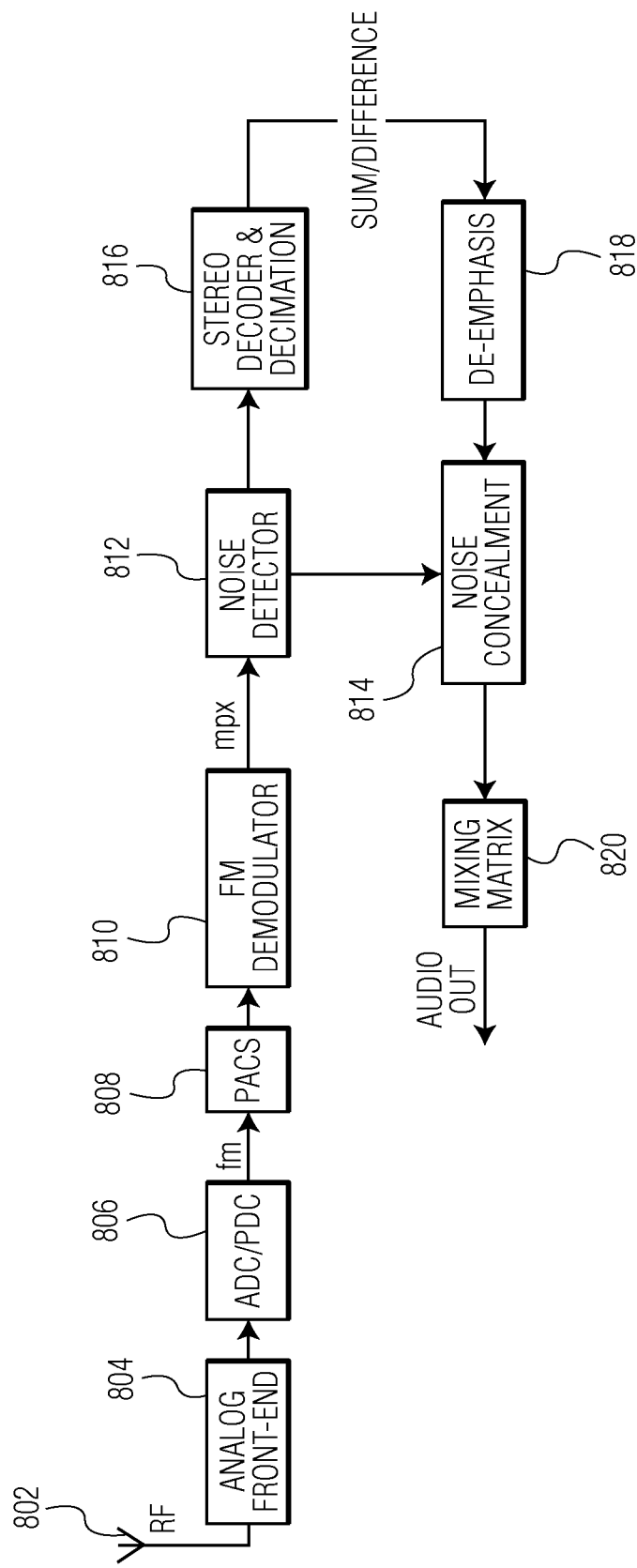
FIG. 8 illustrates schematically an embodiment of the invention in which noise detection is applied to a multiplex signal, while noise concealment is applied to the signal after stereo decoding, decimation and de-emphasis, in an FM radio receiver.

FIG. 8 is a schematic diagram of the architecture of an FM radio receiver incorporating an embodiment of the invention. Many of the features of FIG. 8 are also found in FIG. 6 and are not necessarily described again here in order to avoid repetition.

The FM radio receiver includes a noise detector 812, which is located in the same position as in FIG. 6 and therefore receives a multiplex signal from an FM demodulator 810. The multiplex signals is an example of a signal representative of a stream of audio signal samples.

The FM radio receiver also includes a noise concealer 814, which is located in a different location to that of FIG. 6. In FIG. 8, the noise concealer 814 receives a de-emphasised sum/difference signal from a de-emphasis filter 818. The de-emphasised sum/difference signal is an example of a signal representative of the stream of audio signal samples.

The noise detector 812 and noise concealer 814 receive different signals representative of the same stream of audio samples, in this example.

The noise concealer 814 also receives a noise detection signal from the noise detector 812 which identifies samples of the sum/difference signal that have been distorted by impulse noise. The noise concealer 814 may, for example, operate according to the process of FIG. 4 or FIG. 5.

Figure 9:
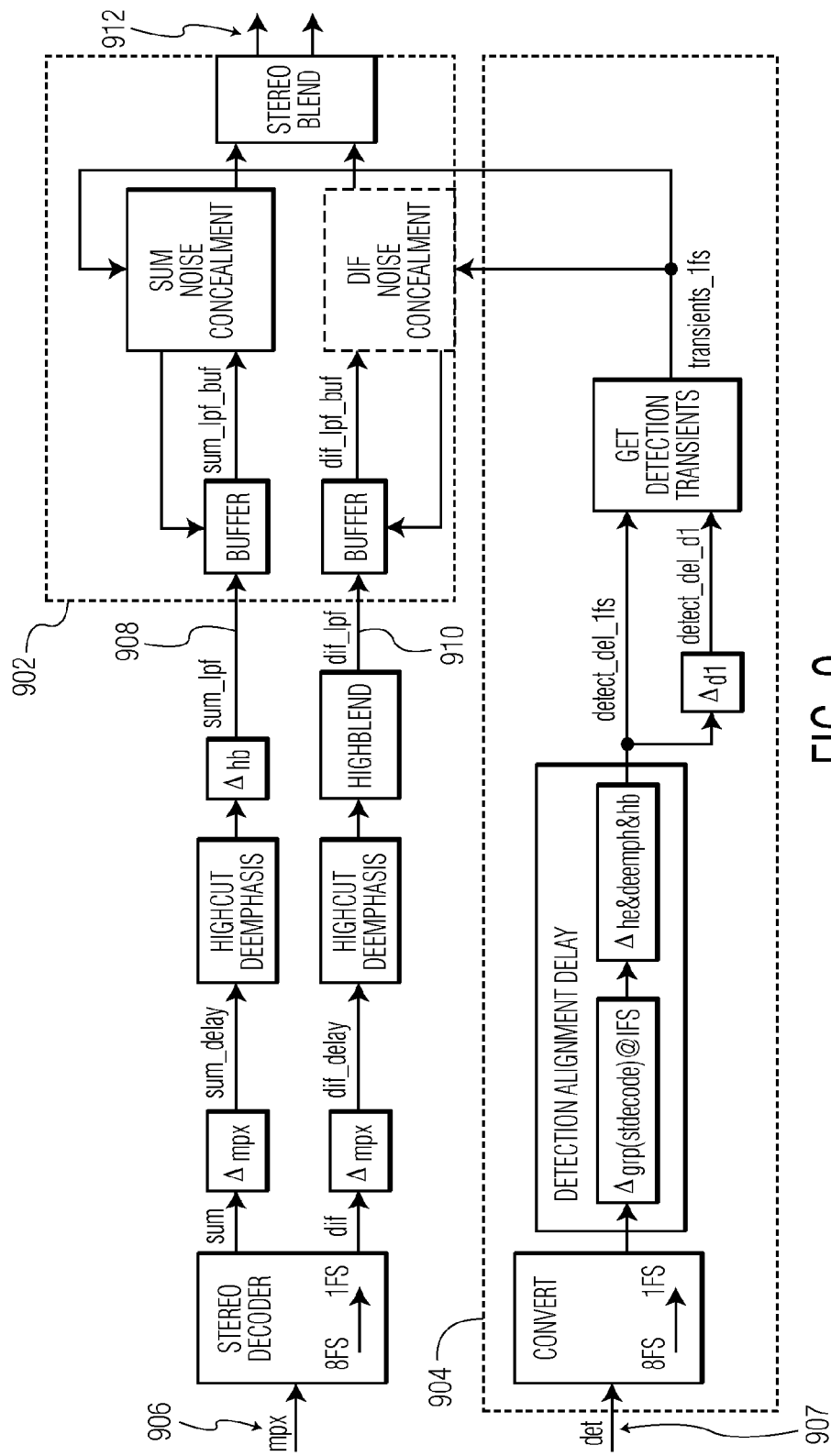
FIG. 9 illustrates a noise detector and a noise concealer according to an embodiment of the invention.

FIG. 9 depicts an exemplary noise concealer 902 and noise detection signal processor 904, which could be used in the FM receiver of FIG. 8. The noise detection signal processor 904 receives a noise detection signal 907 such as the output signal 218 of the noise detector of FIG. 2. The noise concealer 902 receives a sum signal 908 and a difference signal 910 that are derived from the multiplex signal 906. The noise concealer 920 provides reconstructed sum and difference signals 912 with the impulse noise concealed.

Certain advantages and disadvantages exist in implementing the invention in an FM receiver according to either the structure shown in FIG. 6 or FIG. 8. An advantage of applying noise concealment to a multiplex signal, as in FIG. 6, is that the impulse distortion that is to be replaced will be shorter in time as the signal that is reconstructed has not then yet decimated. Disadvantages include that the signal to be reconstructed has a higher bandwidth, which requires the use of a higher order model, and that noise may present a problem for the model estimation of higher frequency signals.

Advantages of applying noise concealment to the sum and difference signals, as in FIG. 8, include the following. The signals for reconstruction have a lower bandwidth and any impulse noise will distort a smaller number of samples compared with the corresponding multiplex signal. This can reduce the computational complexity of implementing embodiments of the invention. Furthermore, noise concealment for the difference signal can be disabled under low quality reception conditions.

As an example, consider a reception channel with only additive white Gaussian noise (awgn) at radio frequency. After demodulation of an FM signal, the awgn property is not valid for the obtained multiplex signal (due to the difference operation). The amount of noise in the multiplex signal increases with the frequency. The difference signal is located around, for example, 38 kHz and the sum signal around the baseband. Therefore, FM stereo sounds noisier than FM mono. Advanced radios gradually band limit the stereo signal with lower reception levels. At some point it gets too noisy and/or the pilot signal gets lost in the noise. In that case mono FM may be preferable and still be good enough to listen to.

In such situations processor capacity may be released for other weak-signal processing tasks. For example, for very weak signals, below the so called FM threshold, click noise can occur. There are signal processing techniques that try to correct these clicks. Hence, the processor capacity can be used to run such algorithms instead.

Conversely, disadvantages of the structure illustrated by FIG. 8 include that the distortion will be spread out in time due to the operation of the decimation filter on the signal before it is reconstructed. Consequently, very high pulse repetitions may be more difficult to deal with compared to using the structure of FIG. 6.

Figure 10:
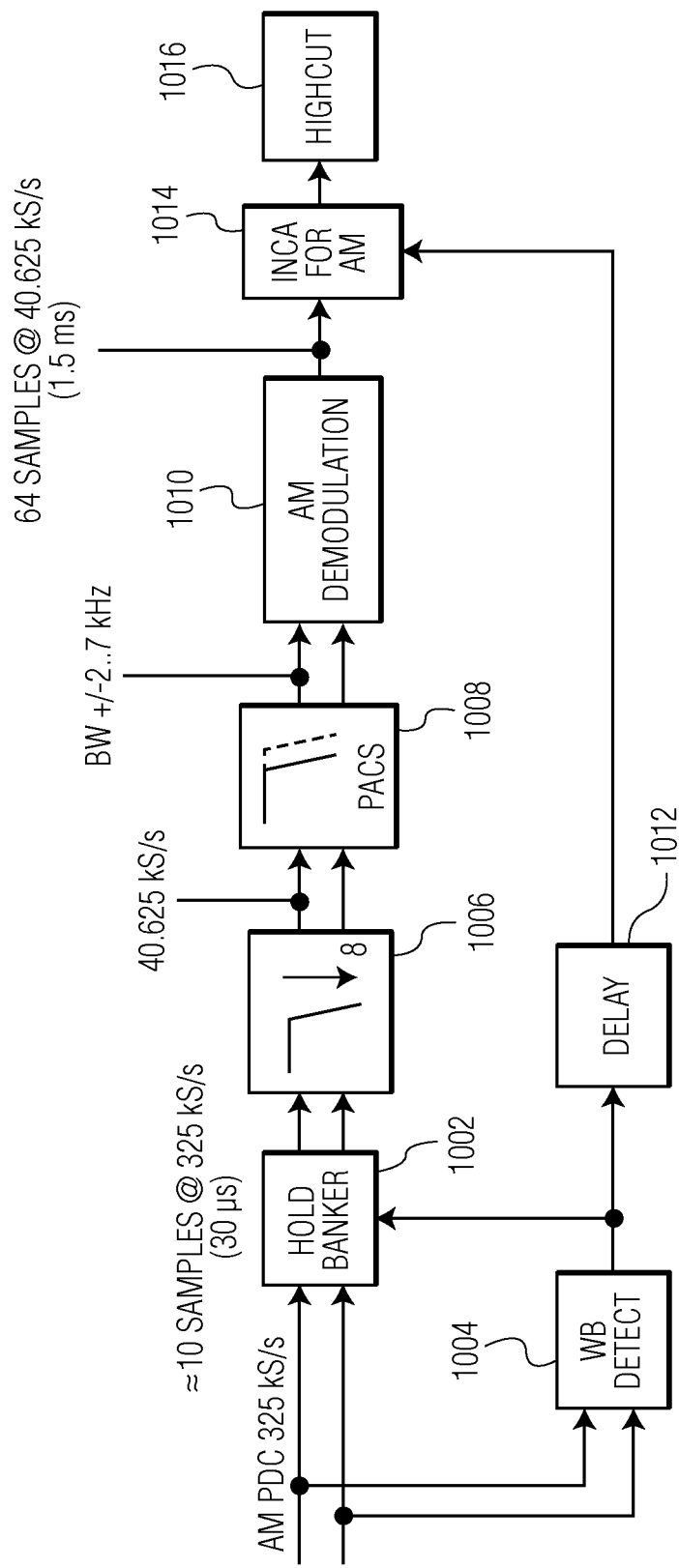
FIG. 10 illustrates schematically an embodiment of the invention in which noise detection and concealment are applied to a an AM signal.

FIG. 10 is a schematic diagram of part of an AM radio reception chain including an impulse noise detector 1004 and noise concealer 1014 according to the present disclosure.

A digitised AM signal is received by both a hold blanker 1002 and an impulse noise detector 1004 of the AM radio receiver chain. The signal at the beginning of the digital signal processing chain has a sampling-rate of 325 kHz and the (complex) signal contains the signal of interest around baseband, plus some adjacent AM channels.

The noise detector 1004 supplies a noise detection signal, representative of the location in the digital signal of impulse noise, to the hold blanker 1002. The hold blanker 1004 then maintains the signal at the same level as immediately before the impulse noise distortion, for the full duration of the impulse noise distortion thereby removing the noisy samples. In conditions where the signal of interest is strong compared to the adjacent channels, this can provide a good improvement to noise reduction. However, the amount of noise reduction may not be acceptable for all applications.

The output signal from the hold blanker 1002 is then bandwidth limited and decimated at block 1006, low-pass filtered at block 1008 and demodulated at block 1010 to provide an audio signal. Demodulation may involve conventional techniques such as envelope detection, carrier/dc removal, etc.

The audio signal is provided as an input to the noise concealer 1014. The noise concealer 1014 in this example also requires a noise detection signal. It can be economical for the noise concealer 1014 to reuse the noise detection signal provided by the noise detector 1004. Of course, it takes a finite period of time to perform the functionality of blocks 1006, 1008 and 1010. Therefore, the noise detection signal is subject to an appropriate delay by a delay element 1012 to provide a delayed noise detection signal to the noise concealer 1014 such that the timing of the noise detection signal received at the noise concealer 1014 corresponds with the timing of the audio signal.

The noise concealer 1014 provides noise concealment, for example, according to the process of FIG. 4 or FIG. 5, to provide an interpolated signal. The interpolated signal is then optionally subjected to further bandwidth reduction, dependent on reception conditions, by a high cut filter 1016, which also acts as a smoothing filter for the interpolated signal.

Figure 11:
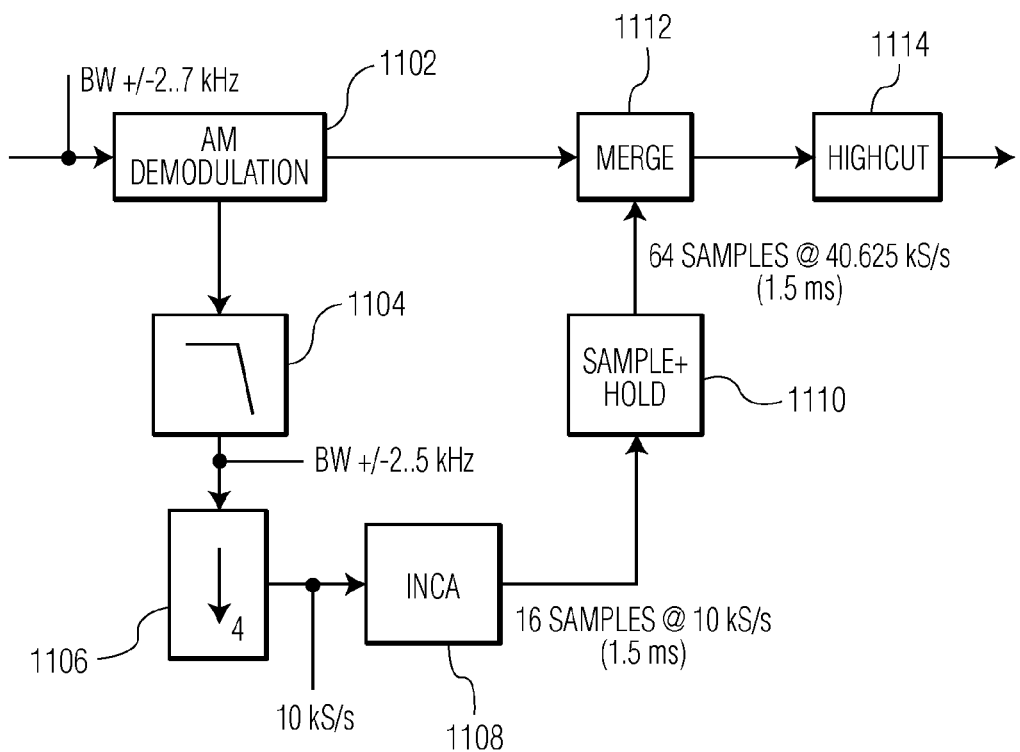
FIG. 11 illustrates schematically an embodiment of the invention in which noise detection and concealment are applied to a an AM signal.

FIG. 11 provides an example of a noise concealer for an AM radio reception chain, such as the noise concealer 1014 shown in FIG. 10. The noise detection signal that is used by the noise concealer of FIG. 11 is not shown in this drawing.

Shown in FIG. 11 is an AM demodulator 102 that provides an AM demodulated signal with a sampling frequency of bandwidth of at most 7 kHz. The demodulated signal is provided to a low-pass filter 1104 to band-limit the signal to 4 kHz. The band-limited signal is then decimated by a decimator 1106. In this illustration, decimation by a factor of 4 is shown. The decimated signal is supplied to an impulse noise concealer 1108, which can track the autocorrelation of the received signal and compute one or more reconstruction samples, for example by using at least part of the process of FIG. 4 or FIG. 5.

Using a decimated and band-limited signal for noise concealment reduces the amount of processing power required. Furthermore, the bandwidth of an AM signal allows decimation and band-limitation without significantly degrading the quality of the noise concealment.

The reconstruction samples are provided to a sample and hold component 1110. The purpose of the sample and hold component 1110 is to modify the number of samples and the sample rate of the reconstruction samples such that they correspond with the AM demodulation signal output by the AM demodulator 1102. In particular, the change in number of samples and sample rate caused by the decimator 1106 before noise concealment should be undone before the reconstruction samples are suitable for incorporating into the AM demodulation signal.

In the example of FIG. 11, the decimator 1106 applies a decimation factor of 4. 16 reconstruction samples are provided by the noise concealer 1108 to the sample and hold component 1110 at a rate of 10,000 samples per second (10 kS/s) over a period of 1.5 ms. The output of the sample and hold component 1110 is 64 samples at a rate of 40.625 kS/s over a period of 1.5 ms. This change in sample rate and duration can be achieved by the sample and hold component 1110 shortening each sample to a quarter of its original time and inserting an additional three copies of each reconstruction sample.

A merger component 1112 receives the AM demodulated signal from the AM demodulator 1102 and the reconstructed samples from the sample and hold component 1110 and merges the two signals such that the distorted samples of the AM demodulated signal are replaced with the reconstruction samples to provide an interpolated signal during the periods when the original signal was distorted by impulse noise.

The signal with noise concealment that is output by the merger 1112 is then provided to a low-pass filter 1114. This low-pass filter 1114 will smooth the transition between the samples of the AM demodulated signal and the reconstructed samples and will also improve the result of the sampling and hold process. Interpolation of a signal will result in the effect that the original signal spectrum is also present (repeated) at higher frequencies of the interpolated signal. The used sample and hold mechanism suppresses some of these spectral components, but usually not sufficiently. Some extra low pass filtering is required to remove the higher frequency components, introduced by the interpolation.

One or more embodiments disclosed herein relate to a signal model-based approach for reducing the audible effects of noise at a radio receiver, such as an AM or FM radio in a vehicle. A purpose of examples disclosed herein is to conceal the audible clicks at the audio output of the radio caused by impulse noise impinged on the reception antenna of the radio receiver, for example caused by the ignition of a vehicle engine. An improvement with regard to the audibility of the noise concealment is achieved by reconstruction of the original signal instead of simply blanking the distorted samples.

Embodiments disclosed herein can consist of two parts, a model estimation (ME) part followed by a signal restoration part (SR). An example of model estimation includes the determination of autoregressive model parameters. An example of signal restoration includes computing and combining forward and backward liner predicted values for samples that have been identified as distorted.

When compared with examples that merely rely on a hold blanker such as the one illustrated in FIG. 10, car radios that included embodiments disclosed herein can provide a substantial improvement in audio quality. The self-distortion caused by the blanking or concealment method itself can be reduced significantly. For typical test bench signals like single tone sinusoids, the distortion level can be almost reduced to the noise floor level. Also for critical test signals like speech signals, the perceptual quality improvement can be considerable.

Other advantages of one or more of the embodiments disclosed herein include:

A smooth transition at both the start and end of the reconstructed samples because both a forward and a backward linear prediction is used to determine the reconstructed samples.

Avoiding a separate training phase can avoid any difficulties that may be encountered with changing signal characteristics after the training has been completed, for example the likelihood that the chosen filter order (number of coefficients) is too low can be reduced. Embodiments of the present disclosure can have a good responsiveness to changing signal characteristics.

The invention claimed is:

1. A signal processing apparatus comprising:
a noise detector configured to:
  receive a stream of information representative of a stream of audio signal samples;
  detect samples in the received stream of information that are distorted by impulse noise in order to generate a noise detection signal, wherein the noise detection signal also identifies preceding and succeeding samples that are undistorted; and
a processor configured to:
  receive a stream of information representative of the stream of audio signal samples;
  receive the noise detection signal from the noise detector;
  determine, based on preceding and/or succeeding undistorted samples in the received stream of audio signal samples, auto-regressive model parameters;
  apply the auto-regressive model parameters to the preceding undistorted samples to determine forward linear predicted values of the distorted samples;
  apply the auto-regressive model parameters to the succeeding undistorted samples to determine backward linear predicted values of the distorted samples;
  combine the forward and backward linear predicted values by means of a window function to determine composite predicted values of the distorted samples;
  replace the distorted samples in the received stream of information with the composite predicted values to provide a reconstructed stream of audio signal samples; and
  determine the stability of the auto-regressive model parameters, and if the stability is determined to be below a predetermined threshold value then replace the estimated auto-regressive model parameters with previously determined stable auto-regressive model parameters for further processing.

2. The signal processing apparatus of claim 1, wherein the processor is configured to receive a different representation of the same stream of audio signal samples to that received by the noise detector.

3. The signal processing apparatus of claim 1, wherein the processor is configured to receive the same representation of the stream of audio signal samples to that received by the noise detector.

4. The signal processing apparatus of claim 3, wherein the processor and the noise detector are configured to receive a multiplex signal representative of the stream of audio signal samples.

5. The signal processing apparatus of claim 1 wherein the processor is configured to calculate an auto-correlation vector in order to determine the auto-regressive model parameters.

6. The signal processing apparatus of claim 5, wherein the processor is further configured to apply lag-windowing to the auto-correlation vector and determine the auto-regressive model parameters using the lag-windowed auto-correlation vector.

7. The signal processing apparatus of claim 1, wherein the processor is configured to determine the auto-regressive model parameters in response to detection of a sample distorted by impulse noise.

8. The signal processing apparatus of claim 1, wherein the processor is configured to calculate an auto-correlation vector in response to receiving an undistorted sample.

9. An integrated circuit comprising the signal processing apparatus of claim 1.

10. A non-transitory computer readable medium having a computer program, which when run on a computer, causes the computer to perform the steps of:
  receiving a stream of information representative of a stream of audio signal samples;
  detecting samples in the received stream of information that are distorted by impulse noise, thereby also identifying preceding and succeeding samples that are undistorted;
  determining, based on preceding and/or succeeding undistorted samples in the received stream of audio signal samples, auto-regressive model parameters;
  applying the auto-regressive model parameters to the preceding undistorted samples to determine forward linear predicted values of the distorted samples;
  applying the auto-regressive model parameters to the succeeding undistorted samples to determine backward linear predicted values of the distorted samples;
  combining the forward and backward linear predicted values by means of a window function to determine composite predicted values of the distorted samples;
  replacing the distorted samples in the received stream of information with the composite predicted values to provide a reconstructed stream of audio signal samples; and
  determining the stability of the auto-regressive model parameters, and if the stability is determined to be below a predetermined threshold value then replace the estimated auto-regressive model parameters with previously determined stable auto-recessive model parameters for further processing.

11. An audio entertainment system comprising the signal processing apparatus of claim 1.

12. A signal processing apparatus comprising:
  a noise detector configured to:
    receive a stream of information representative of a stream of audio signal samples;
    detect samples in the received stream of information that are distorted by impulse noise in order to generate a noise detection signal, wherein the noise detection signal also identifies preceding and succeeding samples that are undistorted;
    receive a multiplex signal representative of the stream of audio signal samples; and
  a processor configured to:
    receive a sum signal and a difference signal representative of the stream of audio signal samples;
    provide a reconstructed sum signal and a reconstructed difference signal; and
  the processor configured to:
    receive a stream of information representative of the stream of audio signal samples; receive the noise detection signal from the noise detector;
    determine, based on preceding and/or succeeding undistorted samples in the received stream of audio signal samples, auto-regressive model parameters;
    apply the auto-regressive model parameters to the preceding undistorted samples to determine forward linear predicted values of the distorted samples;
    apply the auto-regressive model parameters to the succeeding undistorted samples to determine backward linear predicted values of the distorted samples;
    combine the forward and backward linear predicted values by means of a window function to determine composite predicted values of the distorted samples; and
    replace the distorted samples in the received stream of information with the composite predicted values to provide a reconstructed stream of audio signal samples.

13. A signal processing apparatus comprising:
  a noise detector configured to:
    receive a stream of information representative of a stream of audio signal samples;
    detect samples in the received stream of information that are distorted by impulse noise in order to generate a noise detection signal, wherein the noise detection signal also identifies preceding and succeeding samples that are undistorted; and
  a processor configured to:
    receive a stream of information representative of the stream of audio signal samples;
    receive the noise detection signal from the noise detector;
    determine, based on preceding and/or succeeding undistorted samples in the received stream of audio signal samples, auto-regressive model parameters;
    apply the auto-regressive model parameters to the preceding undistorted samples to determine forward linear predicted values of the distorted samples;
    apply the auto-regressive model parameters to the succeeding undistorted samples to determine backward linear predicted values of the distorted samples;
    combine the forward and backward linear predicted values by means of a window function to determine composite predicted values of the distorted samples;
    replace the distorted samples in the received stream of information with the composite predicted values to provide a reconstructed stream of audio signal samples;
    receive the same representation of the stream of audio signal samples to that received by the noise detector;
    subtract a pilot signal from a multiplex signal, to provide a subtracted multiplex signal that is used to estimate the auto-regressive parameters;

add the pilot signal to the reconstructed stream of audio samples; and wherein the processor and the noise detector are configured to receive the multiplex signal representative of the stream of audio signal samples comprising the pilot signal.

14. A method of operating a signal processing apparatus, the method comprising:

receiving a stream of information representative of a stream of audio signal samples;

detecting samples in the received stream of information that are distorted by impulse noise, thereby also identifying preceding and succeeding samples that are undistorted;

determining, based on preceding and/or succeeding undistorted samples in the received stream of audio signal samples, auto-regressive model parameters;

applying the auto-regressive model parameters to the preceding undistorted samples to determine forward linear predicted values of the distorted samples;

applying the auto-regressive model parameters to the succeeding undistorted samples to determine backward linear predicted values of the distorted samples;

combining the forward and backward linear predicted values by means of a window function to determine composite predicted values of the distorted samples; replacing the distorted samples in the received stream of information with the composite predicted values to provide a reconstructed stream of audio signal samples; and determining the stability of the auto-regressive model parameters, and if the stability is determined to be below a predetermined threshold value then replace the estimated auto-regressive model parameters with previously determined stable auto-regressive model parameters for further processing.

\* \* \* \* \*